(12) United States Patent
Davidsson et al.

(10) Patent No.: US 6,525,520 B2
(45) Date of Patent: Feb. 25, 2003

(54) PULSE DETECTOR FOR DETERMINING PHASE RELATIONSHIP BETWEEN SIGNALS

(75) Inventors: Stefan Hans Bertil Davidsson, Skärholmen (SE); Lars Olof Mikael Lindberg, Täby (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/840,176

(22) Filed: Apr. 24, 2001

(65) Prior Publication Data

US 2001/0045822 A1 Nov. 29, 2001

(30) Foreign Application Priority Data

Apr. 25, 2000 (DE) .......................................... 100 20 171

(51) Int. Cl.[7] .............................................. G01R 25/00
(52) U.S. Cl. ................. 324/76.54; 324/76.52; 331/1 A; 331/25; 327/12
(58) Field of Search .................. 331/25, 1 A; 327/12, 327/9; 324/76.54, 617, 76.52, 76.55

(56) References Cited

U.S. PATENT DOCUMENTS

| | | | |
|---|---|---|---|
| 3,947,697 A | 3/1976 | Archer et al. ................ | 327/154 |
| 4,649,438 A | 3/1987 | Shimizu et al. ............... | 331/20 |
| 5,602,512 A | 2/1997 | Neron ........................ | 331/1 A |
| 5,619,148 A | 4/1997 | Guo .............................. | 327/3 |
| 6,313,622 B1 * | 11/2001 | Seki et al. ............... | 324/76.54 |

FOREIGN PATENT DOCUMENTS

| | | |
|---|---|---|
| AU | 705852 | 1/1997 |
| EP | 0010077 A1 | 4/1980 |
| EP | 0424741A2 X | 5/1991 |
| EP | 0709966 A2 | 5/1996 |
| EP | 0831588A2 A | 3/1998 |
| WO | WO97/01901 | 1/1997 |

* cited by examiner

Primary Examiner—Christine Oda
Assistant Examiner—Vincent Q. Nguyen

(57) ABSTRACT

A pulse detector detects if a clock pulse signal is in phase with a reference clock pulse signal in an efficient manner with very high accuracy. The pulse detector includes a first delay unit adapted to receive an input clock pulse signal and to delay the input clock pulse signal by a first pre-specified delay for output as output clock pulse signal, and a second delay unit adapted to delay the output clock pulse signal by a second pre-specified delay. A sampling unit is adapted to sample the input clock pulse signal and the output of the second delay unit at a sampling time defined by a reference clock pulse signal and to output the samples for phase delay indication.

12 Claims, 12 Drawing Sheets

FIG.1

(PRIOR ART)

FIG.2

(PRIOR ART)

PULSE DETECTOR FOR DETERMINING PHASE RELATIONSHIP BETWEEN SIGNALS

FIELD OF INVENTION

The present invention relates to a pulse detector, in particular to a pulse detector adapted to determine whether an input clock pulse signal is in phase with a reference clock pulse signal or not and occupies a pre-defined clock pulse period.

BACKGROUND OF INVENTION

Clock pulse signals are used, e.g., in digital telecom/datacom networks for network synchronization. Network synchronization is necessary to avoid loss of information in case digital data is transported between different nodes in the digital telecom/datacom network.

One application of pulse detection in the sense of the present invention is the phase detection in a delay compensation circuit where two redundant clock pulse signals getting out of phase due to propagation delay differences over a transmission medium are brought in phase with respect to each other before the redundancy is eliminated through selection of one of the clock pulse signals.

Another application of the present invention is the field of phase-locked loops (PLL) where the output clock pulse signal of an oscillator is compared with a reference clock signal and the resulting difference signal is used to control the oscillator frequency such that the phase of the oscillator clock pulse signal is equal to the reference clock pulse signal and maintained in this state.

Yet another application of the present invention is the handling of fault situations where the power supply either to or on printed circuit boards gets faulty. From this it follows that the clock pulse signal will not disappear immediately but gets more and more distorted. Assuming, e.g., that the clock pulse signal duty cycle initially is 50/50, it will deteriorate to 45/55, 40/60 and so forth until it finally disappears. This leads to problems since usually the clock pulse signal is not isolated until it is detected as faulty. The same applies if a circuit driver gets faulty leading to non-equally sharp rising and falling edges of the clock pulse signal and thus to a change of the duty cycle as well.

Yet another application of the present invention relates to parts of digital telecom/datacom networks that are provided in a redundant way to increase reliability. While it is not a problem if some of the clock pulse signals disappear a problem arises in case a clock pulse signal only deteriorates and is further used within the digital telecom/datacom network. Specifically, with clock pulse signals used for digital telecom/datacom network synchronization it would be extremely valuable to detect faults very early on before they affect the digital telecom/datacom system characteristics. Here, pulse detection is an effective way for early fault detection.

In particular with respect to digital telecom/datacom network synchronization, different approaches to phase detection are known in the prior art.

In EP 0 010 077 there is described a method and arrangement for regulating the phase position of a controlled clock pulse signal in relation to a reference clock pulse signal in a telecommunication network. Here, a reference clock pulse signal is delayed in a delay circuit and then compared with a controlled clock pulse signal in a first comparison circuit producing a first comparison signal in dependence on the phase difference between the delayed clock pulse signal and the controlled clock pulse signal. Also, the controlled clock pulse signal is delayed in a second delay circuit and then compared in a second comparison circuit with the reference clock pulse signal. The second comparison circuit produces a second comparison signal in dependence on the phase difference between the delayed controlled clock pulse signal and the reference clock pulse signal. The outputs of both comparison circuits are connected to a logic circuit for further control of the controlled clock pulse signal.

Another approach to phase detection is known from U.S. Pat. No. 3,947,697 and EP 0 709 966 A2 and shown in FIG. 1. Here, an input clock reference signal is supplied, firstly, via delay unit 100 to a sampling unit 102 and, secondly, directly thereto. Typically, the sampling unit 102 comprises at least two flip-flops and samples both the delayed and the non-delayed input clock reference signal for subsequent output thereof. The operation of the sampling unit 102 is triggered by a reference clock pulse signal $\phi_R(t)$. FIG. 2 shows the timing diagram illustrating the operation of the phase detector shown in FIG. 1. As shown in FIG. 2, at the input of the sampling unit 102 there are supplied the input clock reference signal $\phi(t)$ and the delayed input clock reference signal $\phi(t-d)$. The lower part of FIG. 2 shows three typical operative conditions for the phase relationship between the input clock pulse signal $\phi(t)$ and the reference clock pulse signal $\phi_R(t)$). In case the reference clock pulse signal ($\phi_R(t)$) is early with respect to the input clock pulse signal $\phi(t)$ ($\delta<0$) a sample/hold operation for the input clock pulse signal $\phi(t)$ and the delayed input clock pulse signal $\phi(t-d)$ leads to a sample vector [0,0]. Otherwise, in case the reference clock pulse signal $\phi_R(t)$ is late with respect to the input clock pulse signal $\phi(t)$ and the delayed input clock pulse signal $\phi(t-d)$, the sample vector will be [1,1]. In an intermediate time period defined by the delay d of the delay unit 100, however, the simultaneous sampling of the input clock pulse signal $\phi(t)$ and the delayed input clock pulse signal $\phi(t-d)$ leads to an output sample vector [1,0] thus indicating an in-phase relationship.

Figure 1:
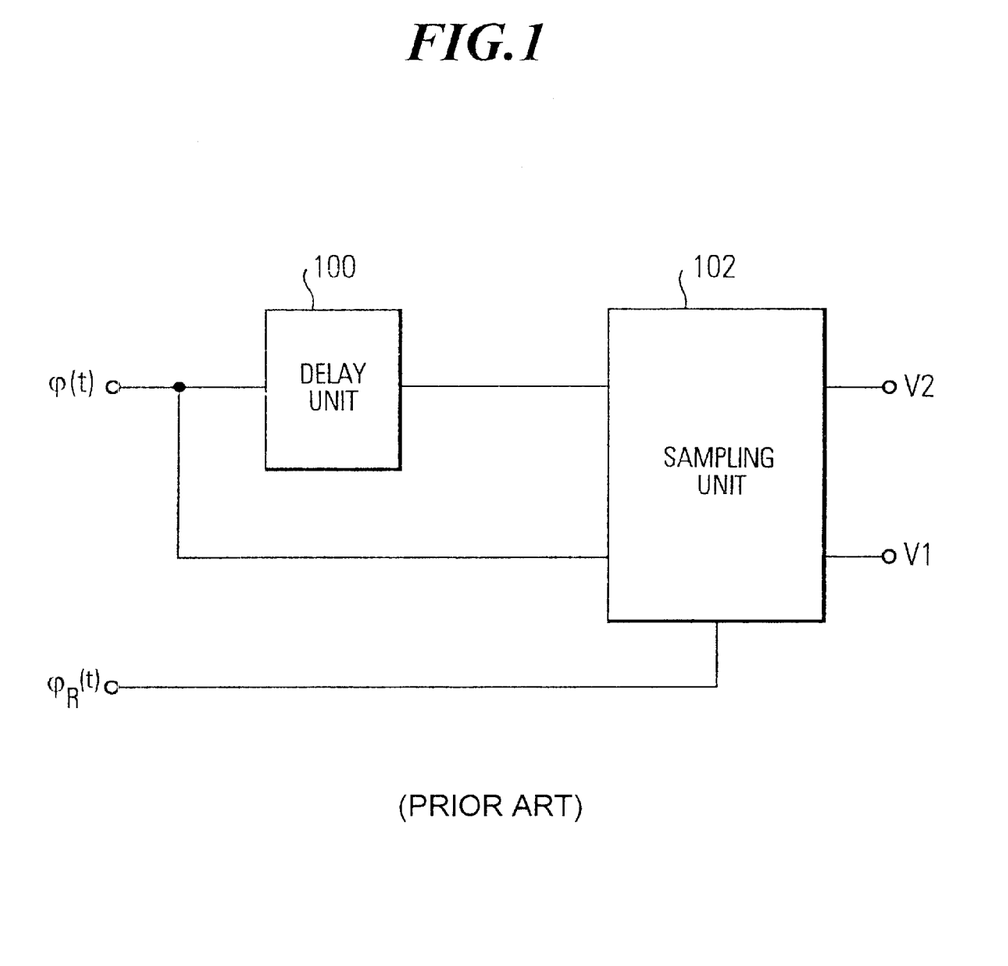
FIG. 1 shows a schematic diagram of a phase detector known from prior art.
Figure 2:
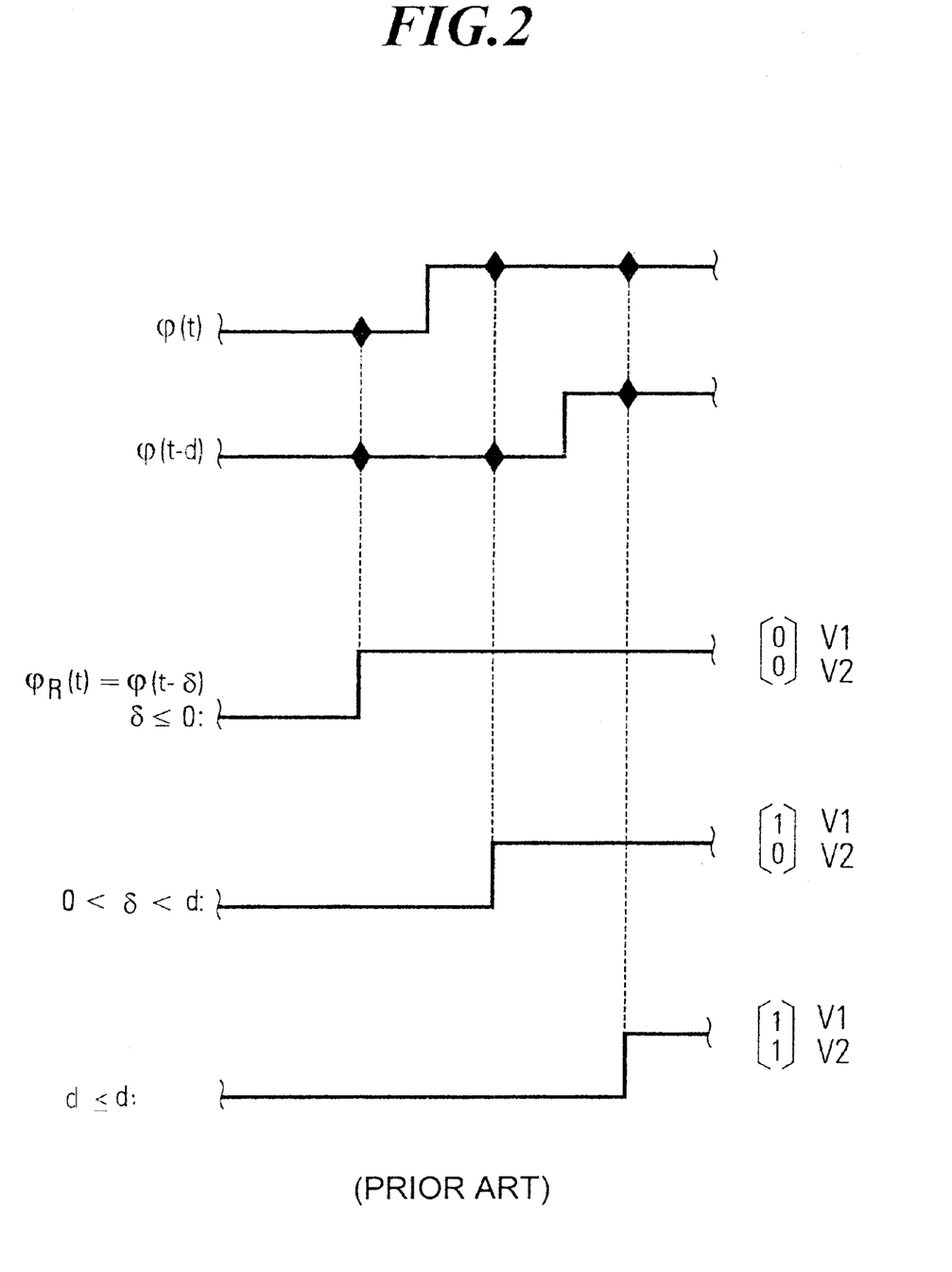
FIG. 2 shows a signal diagram illustrating the operation of the phase detector shown in FIG. 1.

While the circuit illustrated in FIGS. 1 and 2 is effective to determine the phase relationship between an input clock pulse signal $\phi(t)$ and a reference clock pulse signal $\phi_R(t)$, one problem is that the time resolution for phase detection d depends on the operation characteristics and speed of the sampling unit 102. In other words, the smaller the time resolution d for phase detection is the higher the operation speed of the sampling unit 102 must be. However, there are inherent limits to the operation speed of the sampling unit 102. In view of the ever increasing frequencies of clock pulse signals in current digital telecom/datacom networks in the GHz range and beyond the increase of the operation speed of the sampling unit 102 alone does not allow to handle the more and more demanding requirements for, e.g., phase relationship of different high frequency clock pulse signals. The same applies in case a time period of a clock pulse signal with respect to a reference clock pulse signal must be determined for pulse distortion indication.

SUMMARY OF INVENTION

In view of the above, a first object of the invention is to detect if a clock pulse signal is in phase with a reference clock pulse signal in an efficient manner with very high accuracy.

According to the present invention this object is achieved through a pulse detector having the features of claim 1 and through a pulse detection method having the features of claim 10.

The present invention proposes a very effective way to increase the time resolution for clock pulse signal phase detection while simultaneously reducing the hardware effort.

In particular, it is proposed to use a pulse detector having not only a single delay unit but a first delay unit and a second delay unit. The output clock pulse signal is derived between the first delay unit and the second delay unit while the input of the first delay unit and the output of the second delay unit are provided to a sampling unit operating at a sampling time defined by a reference clock pulse signal and to output the sample for phase delay indication.

Therefore, according to the present invention it is proposed to use a time window split into two parts being defined by the delay of the first delay unit and the second delay unit. The output clock pulse signal is derived at the middle of this time interval. In case an output sample vector [1,0] indicates an in-phase relationship between the input clock pulse signal and the reference clock pulse signal there is also available the information that the time delay between the output clock pulse signal and the reference clock pulse signal is at most the maximum delay of the first and/or second delay unit.

In other words, while the time resolution according to the prior art is determined by the delay of a single delay unit according to the present invention the time resolution is imp roved by a factor being determined by the greater of the two delay times of the firs t and second delay unit to the overall delay time of both delay units, typically by a factor of 2.

The increase in time resolution may be achieved by branching off the output clock pulse signal within, e.g., at the middle of the time interval being reserved to indicate phase coincidence between an input clock pulse signal and a reference clock pulse signal. Therefore, in case delay elements are built from a plurality of delay elements this advantage is achieved without any extra hardware effort at all. The present invention requires neither high frequency help signals nor PLL circuits and/or software support anyway. Since the invention uses directly the clock pulse signals to be compared the pulse detector is operated at these frequencies by simultaneously avoiding increased sampling rates being significantly higher than the frequencies of the clock pulse signals to be processed. Also, all control signals are generated within the same clock pulse system.

Therefore, the invention may be implemented using only a minimum number of simple components in hardware by achieving extremely good accuracy. Further, the pulse detector according to the present invention may be easily implemented, e.g., as ASIC circuitry.

Another object of the invention is to detect if the duty cycle of a clock pulse signal is in compliance with a reference clock period of a reference clock pulse signal or not.

According to the present invention this object is achieved through a pulse detector having the features of claim 6 and a pulse detection method having the features of claim 11.

Therefore, the same principle being applied to the detection of phase coincidence between an input clock pulse signal and a reference clock pulse signal may also be used to determine whether the duty cycle of the input clock pulse signal coincides with the duty cycle of the reference clock pulse signal. Heretofore, again a window is defined for the negative edge of the input clock pulse signal for comparison with the inverted reference clock pulse signal using the same principles outlined above and achieving related advantages.

Overall, th e pulse detector according to the present invention gives an extremely sensible and fast detector for many difficult fault situations where the signal is initially only deteriorated and does not disappear.

DESCRIPTION OF DRAWINGS

In the following, the present invention will be explained with reference to the drawings in which.

DESCRIPTION OF PREFERRED EMBODIMENTS

Figure 3:
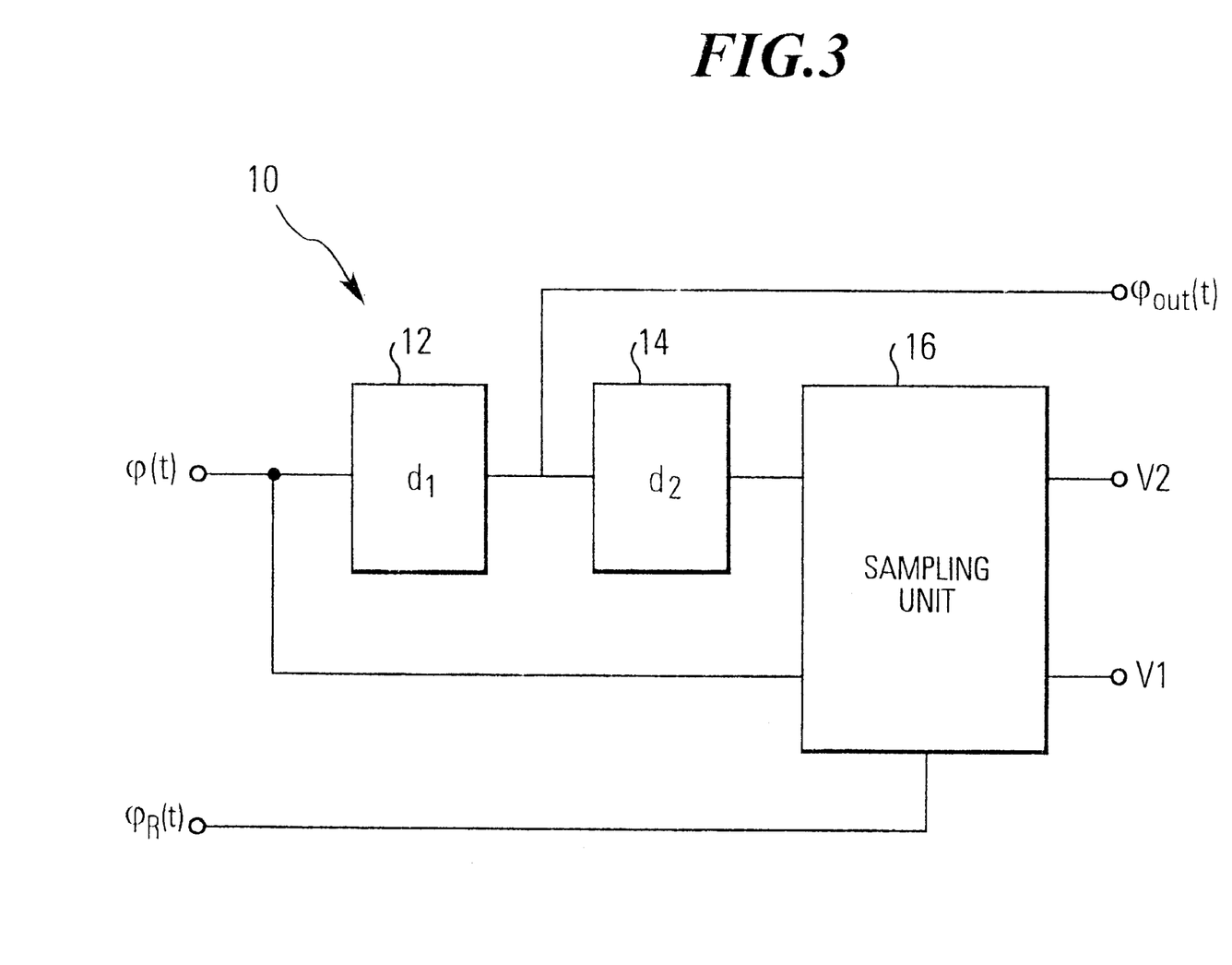
FIG. 3 shows a schematic diagram of a pulse detector according to the present invention.

FIG. 3 shows a schematic diagram of a pulse detector according to the present invention. The pulse detector 10 comprises a first delay unit 12 adapted to receive an input clock pulse signal $\phi(t)$ and to delay the input clock pulse signal $\phi(t)$ by a first predetermined delay $d_1$. The output signal of the first delay unit 12 is identical to the output clock pulse signal $\phi_{out}(t)$ of the pulse detector. The output of the first delay unit 12 is connected to the input of the second delay unit 14 that delays the output clock pulse signal $\phi_{out}(t)$ by a second prespecified delay $d_2$. The output of the second delay unit 14 is supplied to a sampling unit 16 which also directly receives the input clock pulse signal $\phi(t)$. The operation of the sampling unit 16 is triggered by a reference clock pulse signal $\phi_R(t)$. Operatively, the sampling unit 16 is adapted to sample the input clock pulse signal $\phi(t)$ and the output of the second delay unit 14 at a sampling time defined by the reference clock pulse signal $\phi_R(t)$. The result of this operation is output as samples [v2, v1] for phase delay indication.

Figure 4:
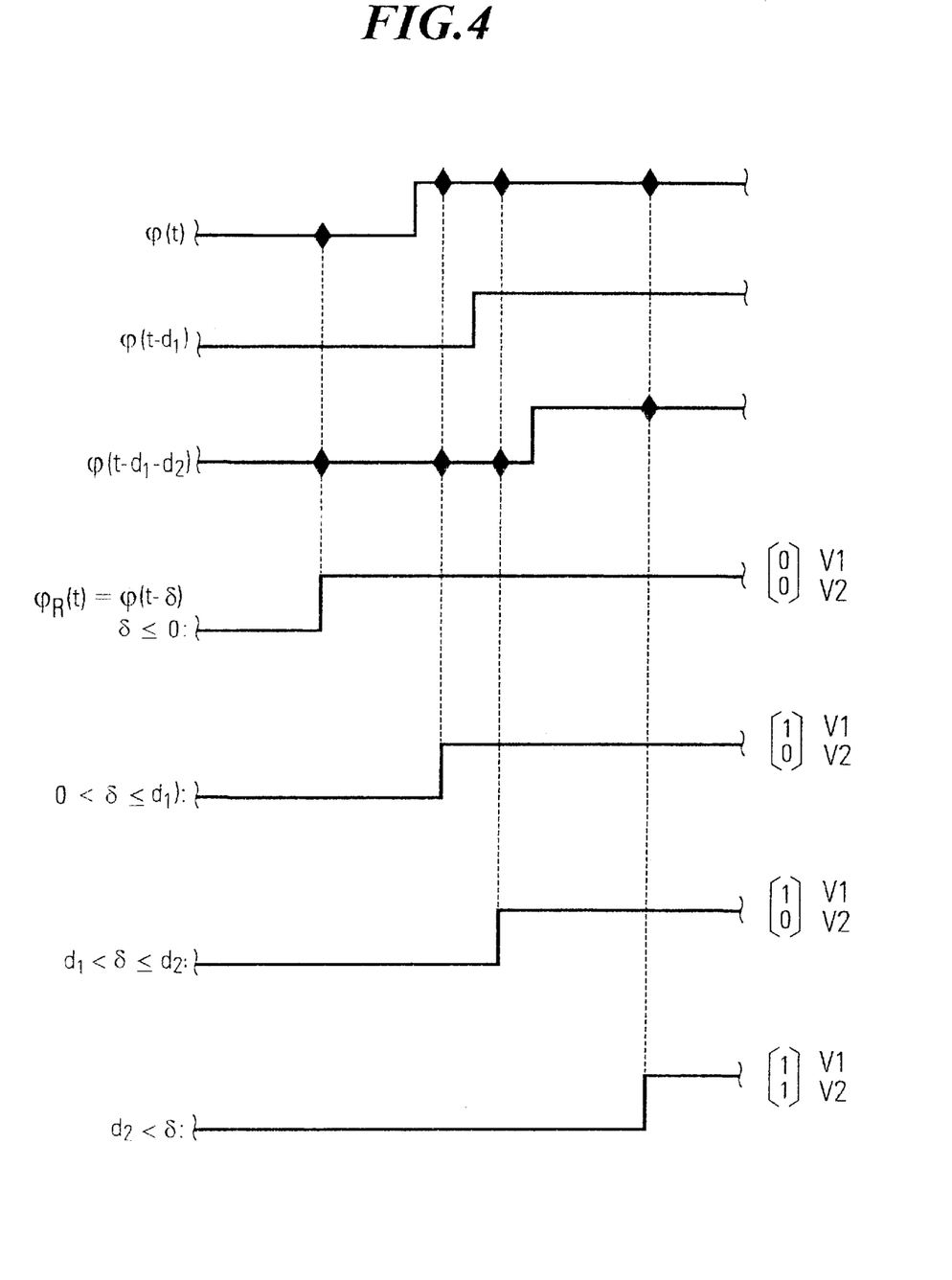
FIG. 4 shows a signal diagram illustrating the operation of the pulse detector shown in FIG. 3.

FIG. 4 shows a timing diagram illustrating how such a phase delay indication may be achieved through the pulse detector shown in FIG. 3.

The input clock signal $\phi(t)$ is delayed twice by a first delay $d_1$ and a second delay $d_2$. The input clock pulse signal delayed once is the output clock pulse signal $$\phi_{out}(t)=\phi(t-d_1).$$

As shown in FIG. 4 and outlined above in a general sense, there are three cases where the reference clock pulse signal is early, in-phase, or late with respect to the input clock pulse signal. The cases are distinguished through sampling of the input clock pulse signal $\phi(t)$ and the output of the second delay unit $\phi(t-d_1-d_2)$.

In the early case ($\delta < 0$) both samples will have a value of 0 so that the output vector of the sampling unit 16 is [0,0].

In the late case both sampling values will have a value of 1 so that the output vector of the sampling unit 16 is [1,1].

Finally, in the in-phase case, e.g., the positive edge of the input clock pulse signal $\phi(t)$ will lie before the positive edge of the reference clock pulse $\phi_R(t)$ which again lies before the positive edge of the delayed input clock pulse signal $\phi(t-d_1-d_2)$ so that the output vector of the sampling unit 16 is [1,0].

While previously the time resolution for the phase detection has been determined by the interval where the output sample vector is [1,0] the case is different with the present invention. Since it is known that $\phi_{out}(t)=\phi(t-d_1)$ lies in the middle of the interval where the output sample vector is [1,0] it is known that the difference between the reference clock pulse signal $\phi_R(t)$ and $\phi(t-d_1)$ is at most max{d1,d2}.

In other words, the time window does not start at a positive edge of any of the involved clock pulse signals but splits into a part extending in advance of such a positive edge and a part extending behind such a positive edge to increase time resolution accordingly.

Overall, the functionality of the pulse detector shown in FIG. 3 may be summarized as follows:

| [v2, v1] | Meaning |
|---|---|
| [0, 1] | $\phi_{out}(t)$ and $\phi_R(t)$ are in phase with a delay of max {d1, d2}; |
| [1, 1] | $\phi_{out}(t)$ early at least by $d_2$; |
| [0, 0] | $\phi_{out}(t)$ late at least by $d_1$; |

Figure 5:
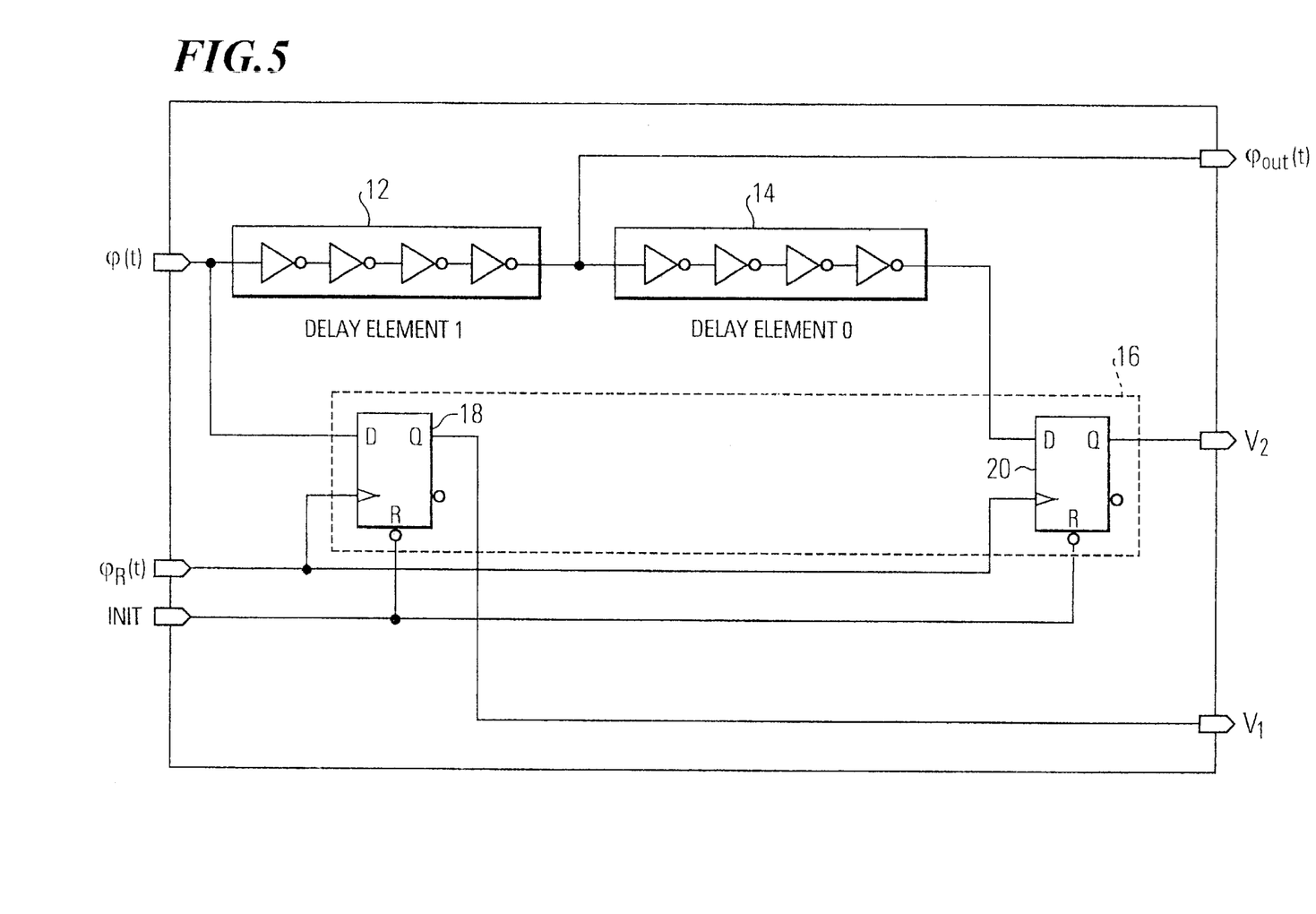
FIG. 5 shows a circuit diagram of the pulse detector according to the present invention shown in FIG. 3.

FIG. 5 shows a circuit diagram of the pulse detector according to the present invention shown in FIG. 3.

As shown in FIG. 5, each delay unit 12, 14 may be implemented using a sequence of inverters. Preferably, the overall delay of each delay unit is not higher than 1 nsec. The first sampling unit 16 divides into a first bistable unit 18 and a second bistable unit 20.

While FIG. 5 shows a D-type flip-flop as one example of a bistable unit it should be noted that any other type of bistable device, e.g., a JK-type bistable unit may be used as long as a sample/hold functionality is achieved.

While above a delay time of 1 nsec is mentioned it should be noted that this value has to be considered as an example only and in general the specific value of the selected overall delay will depend on available circuit and/or integration technologies.

Yet another factor driving the choice of the overall delay is the consideration of meta-stability. Meta-stability relates to certain circumstances where data at the input of the bistable units 18, 20 changes more or less at the same time as the triggering edge of the related reference clock pulse signal $\phi_R(t)$ In this case the output of the bistable units 18, 20—e.g., a flip flop—can be a voltage level lying between the voltage value defined for the logic level high and the voltage level defined for logical level low during some time. Only hereafter the output voltage either reaches the voltage level defined for the logical level high or the voltage level defined for logical level low. This may cause excessive power dissipation and shorten the life time of the bistable units 18, 20.

Therefore, to get good phase detection accuracy while simultaneously avoiding meta-stability problems there exists a design tradeoff. In other words, the delay time of the delay units should be as small as possible and at the same time the set-up and hold requirements of the bistable units 18, 20 should be kept in mind.

In case the delay time is selected too small there exists a possibility that, e.g., both bistable units 18, 20 of the sample unit 16 get into the meta-stability state which means that the output vector could become either of 00, 01, 10, or 11. This would lead to problems in the subsequent phase adjustment control logic.

To the contrary if the time window is large enough to avoid this problem while at the same time maximizing the phase detection resolution the bistable units 18, 20 will not stay in a meta-stability state. This keeps power dissipation down and enhances life time of the bistable units 18, 20.

Thus, according to the present invention the bistable units 18, 20 having the shortest possible set-up time are recommended. To get the best accuracy the delay of the two delay units 12, 14 should be small but well above the set-up time of the bistable units 18 and 20 to avoid meta-stability problems.

As shown in FIG. 5, the first bistable unit 18 generates a first sample of the input clock pulse signal $\phi(t)$ at a sampling time defined by the reference clock pulse signal $\phi_R(t)$. The output of the first bistable unit 18 establishes one output of the sampling unit 16.

Further, the second bistable unit 20 is adapted to generate a second sample of the output signal being supplied by the second delay unit 14 again at the sampling time defined by the reference clock pulse signal $\phi_R(t)$. The output of the second bistable unit 20 establishes the second output of the sampling unit 16.

Therefore, the pulse detector 10 compares the phase of the input clock pulse signal $\phi(t)$ before the first and after the second delay unit with the reference clock pulse signal $\phi_R(t)$. In particular, the bistable unit 18 compares the phase of the input clock pulse signal before the first delay element 12 and the second bistable unit 20 compares the phase of the delayed input clock pulse signal at the output of the second delay unit 14. Since the output clock pulse signal $\phi_{out}(t)$ is taken between the first delay unit 12 and the second delay unit 14 the pulse detector 10 compares the phase one delay time di before and one delay time d2 after the output clock pulse signal $\phi_{out}(t)$ Depending on the two delays $d_1, d_2$ there is a window of the size $d_1$ plus $d_2$ where the output clock pulse signal $\phi_{out}(t)$ is considered to be in phase with the reference clock pulse signal $\phi_R(t)$. In case the output clock pulse signal is falling into this window the phase is considered to be aligned. Otherwise a closed loop system may be used to lock the output clock pulse signal $\phi_{out}(t)$ to the reference clock pulse signal $\phi_R(t)$.

Figure 6:
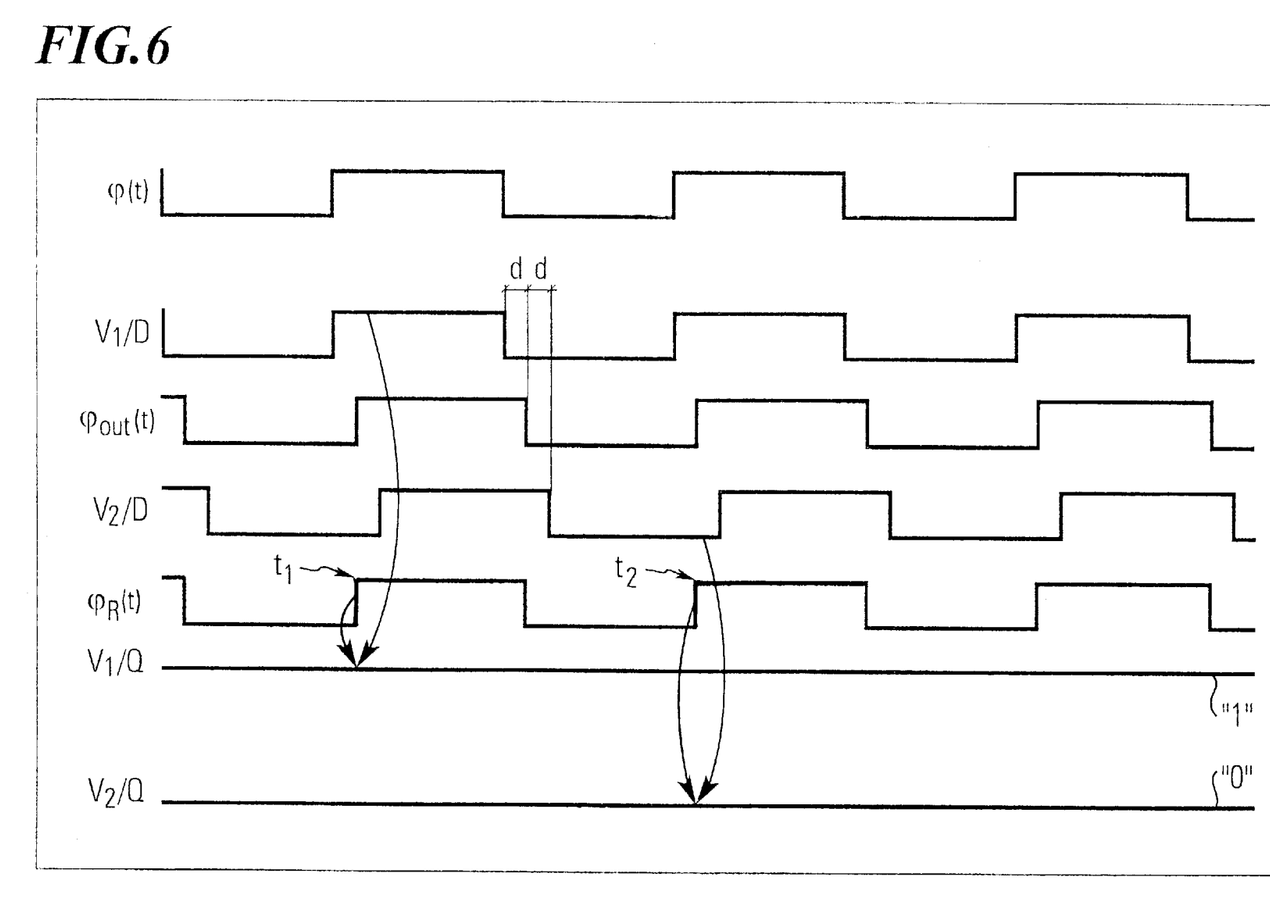
FIG. 6 shows a signal diagram illustrating the operation of the pulse detector shown in FIG. 5.
Figure 7:
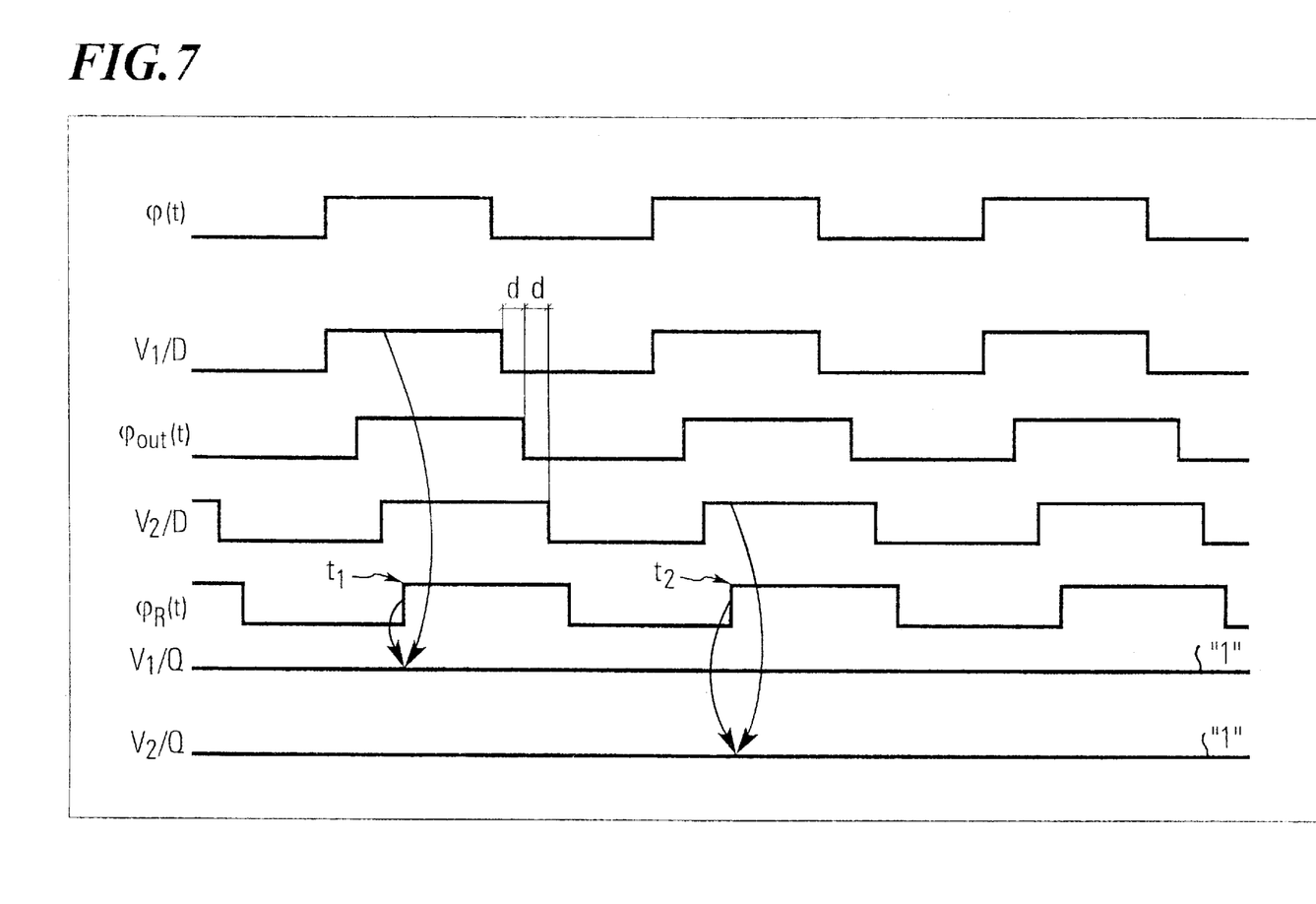
FIG. 7 shows a signal diagram illustrating the operation of the pulse detector shown in FIG. 5.
Figure 8:
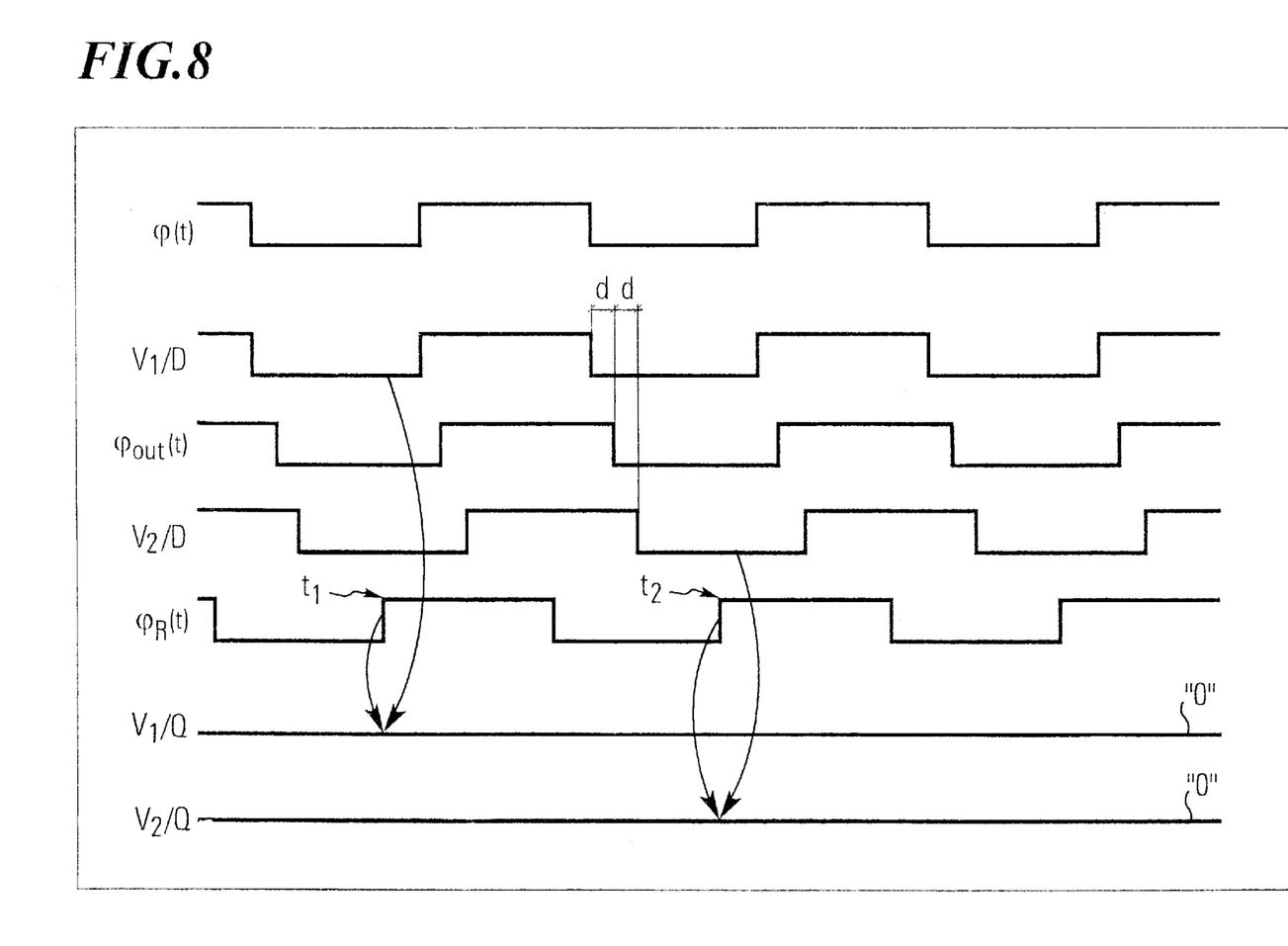
FIG. 8 shows a signal diagram illustrating the operation of the pulse detector shown in FIG. 5.

FIGS. 6 to 8 show timing diagrams illustrating the operation of the pulse detector shown in FIG. 5 for the in-phase, the early-phase and the late-phase case, respectively. For each figure there is made a difference between a signal $V_i/D$ supplied to a bistable device and the output signal $V_i/Q$ thereof. Also, each figure shows the input clock pulse signal $\phi(t)$, the output clock pulse signal $\phi_{out}(t)$, and the reference clock pulse signal $\phi_R(t)$ To understand the signal diagrams shown in FIGS. 6 to 8 it is important to know that the bistable units 18, 20 of the sampling unit 16 operate as edge-triggered flip flops. In other words, at the positive edge of the reference clock pulse signal $\phi_R(t)$—i.e. at the time $t_1, t_2, \ldots$—the signals at the input $V_i/D$ of the bistable device is forwarded to the output $V_i/Q$ thereof.

Therefore, at each in stant in time ti the value of $V_i/D$ is forwarded to the output $V_i/Q$ leading to the sampling vector

[1,0] for the in-phase, as shown in FIG. 6. To the contrary, in the early case the sampling vector [1,1] and in the late case the sampling vector [0,0] is generated, as shown in FIGS. 7 and 8.

From the FIGS. 6 to 8 it may be seen that the output of the sampling vector is maintained stable as long as the phase relationship between the input clock pulse signal φ(t) and the reference clock pulse signal $φ_R(t)$ does not change.

While in the above the concept underlying the present invention has been explained with reference to the positive edge of the reference clock pulse signal for the person skilled in the art it is apparent that the same applies in case the bistable units 18, 20 of the sampling unit 16 are latched using the negative edges of the reference clock pulse signal $φ_R(t)$.

Also, in case the pulse detector described so far is used in a delay compensation circuit the sampling vector [v2, v1] may be used to control the increase or decrease of the delay of the input clock pulse signal. Heretofore, the two sampling signals are supplied to a control logic adapted to adjust the delay of the input clock pulse signal φ(t) until the first bistable unit 18 but not the second bistable unit 20 has detected, e.g., a positive edge leading to a sampling vector of [1,0].

Figure 9:
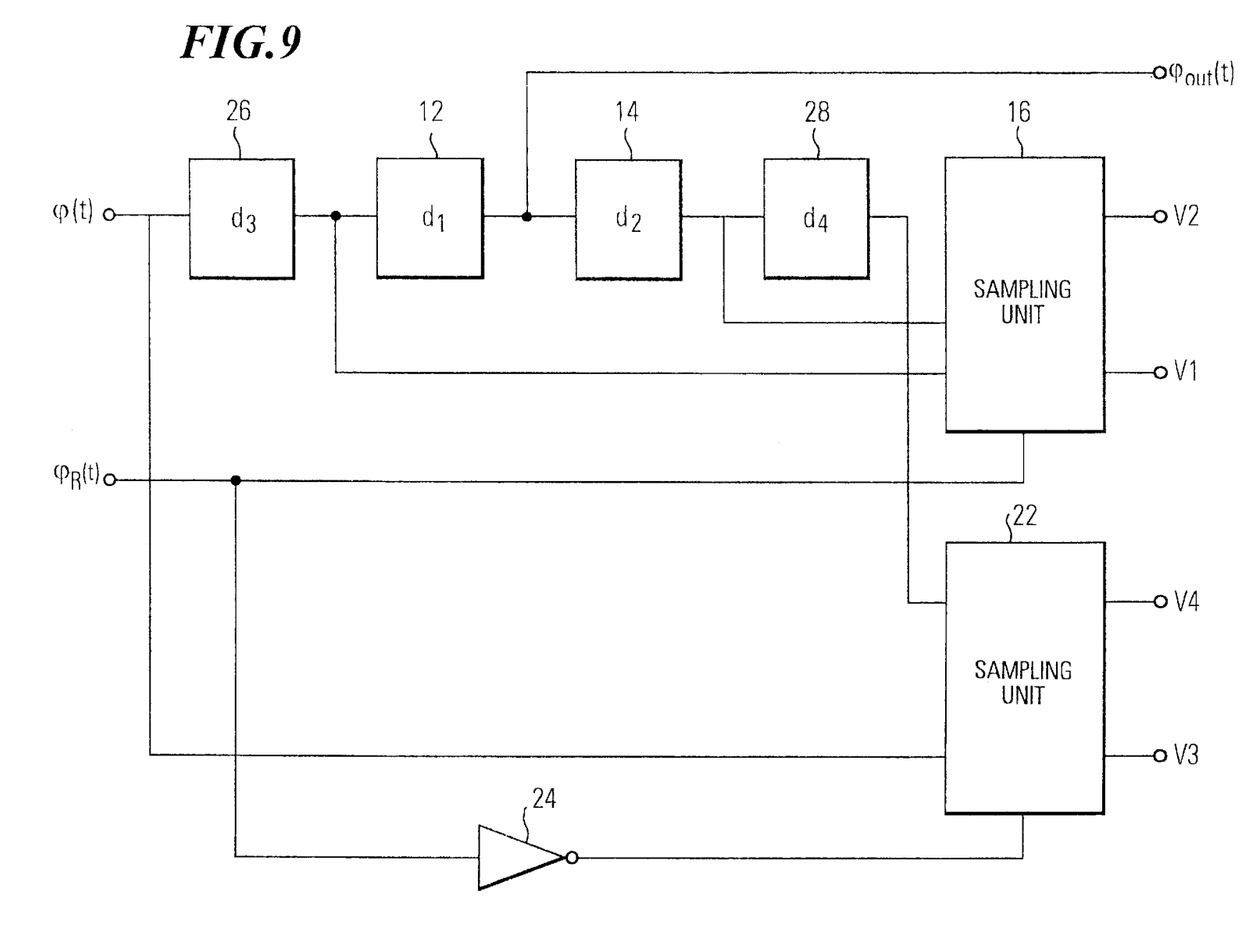
FIG. 9 shows a schematic diagram of a further pulse detector according to the present invention.

FIG. 9 shows a schematic diagram of a further pulse detector according to the present invention being particularly adapted to evaluate the duty cycle of an input clock pulse signal φ(t) with respect to the duty cycle of a reference clock pulse signal $φ_R(t)$ As shown in FIG. 9, according to the present invention it is proposed to add a further sampling unit 22 the operation of which is triggered by an inverted reference clock pulse signal $φ_{R, inv}(t)$ being supplied from an inverter 24.

To flexibly adapt the time window for the measurement in the sampling unit 22 there may be provided a third delay unit 26 receiving the input clock pulse signal φ(t) and delaying it by a third prespecified delay $d_3$ before supply to the first delay unit 12.

Accordingly, at the output of the second delay unit 14 there may be provided a fourth delay unit 28 receiving the output signal of the second delay unit 14 and delaying by a fourth prespecified delay $d_4$ before supply to the second sampling unit 22.

The second sampling unit 22 is adapted to sample the input clock pulse signal φ(t) and the output of the fourth delay unit 28 at a sampling time defined by the inverted reference clock pulse signal φR, inv(t) and to output the samples [v4, v3] as an indication of coincidence of the falling edge of the input clock pulse signal φ(t) and the falling edge of the reference clock pulse signal $φ_R(t)$ or equivalently the rising edge of the inverted reference clock pulse signal $φ_{R, inv}(t)$.

Therefore, the output of both the sampling unit 16 and the sampling unit 22 together give an information of the coincidence of the positive and negative edge of the input clock pulse signal and the reference clock pulse signal $φ_R(t)$ and therefore also an indication of the coincidence of the related duty cycles.

Figure 10:
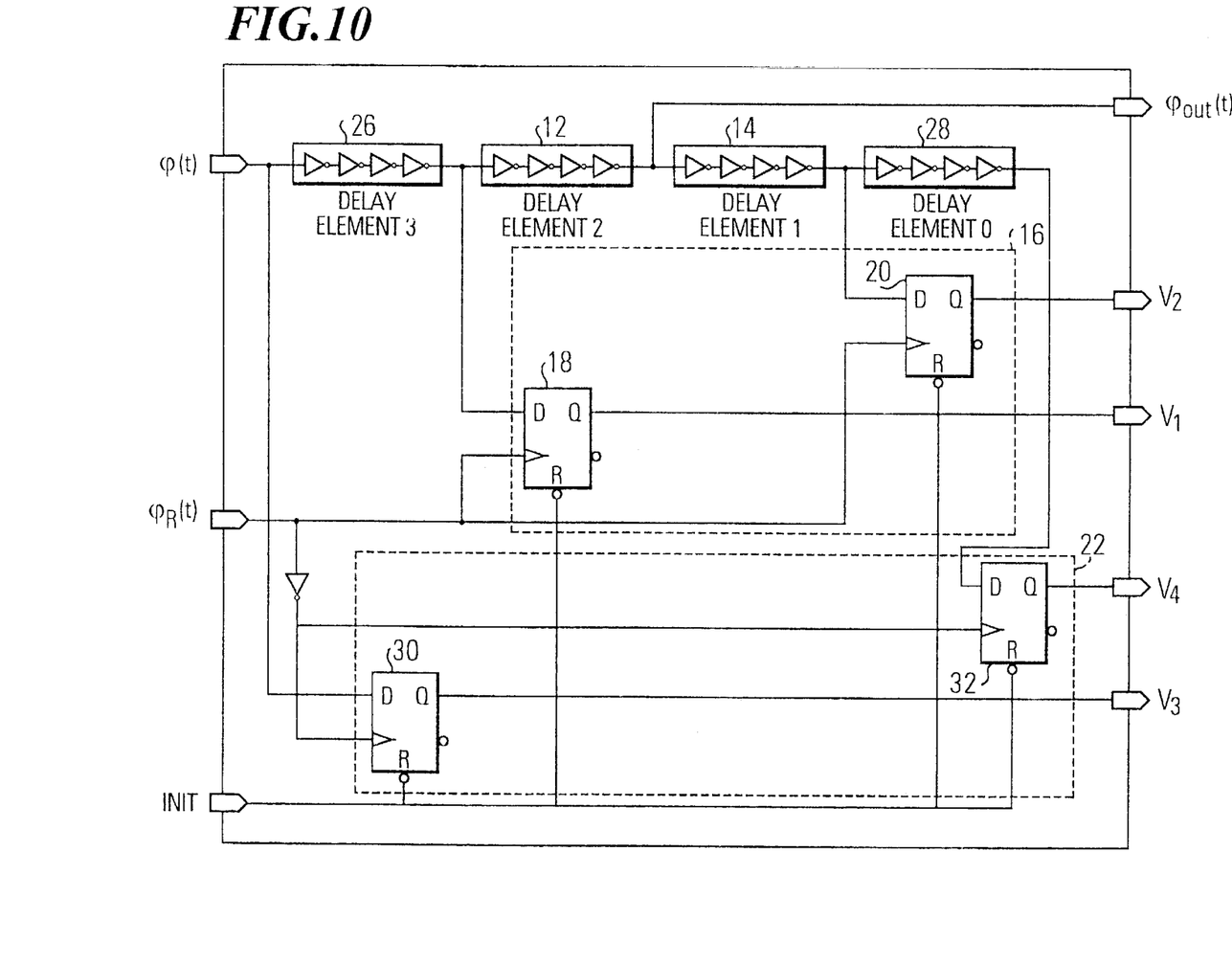
FIG. 10 shows a circuit diagram of the pulse detector according to the present invention shown in FIG. 9.

FIG. 10 shows a circuit diagram of the pulse detector adapted for pulse distortion detection according to the present invention.

As shown in FIG. 10, the second sampling unit 22 comprises a third bistable unit 30 adapted to generate a third sample of the input clock pulse signal φ(t) at the sampling time defined by the inverted reference clock pulse signal $φ_R(t)$. Also, the second sampling unit 22 comprises a fourth bistable unit 32 adapted to generate a fourth sample of the output signal of the fourth delay unit 28 again at the sampling time defined by the inverted reference clock pulse signal $φ_{R, inv}(t)$.

Figure 11:
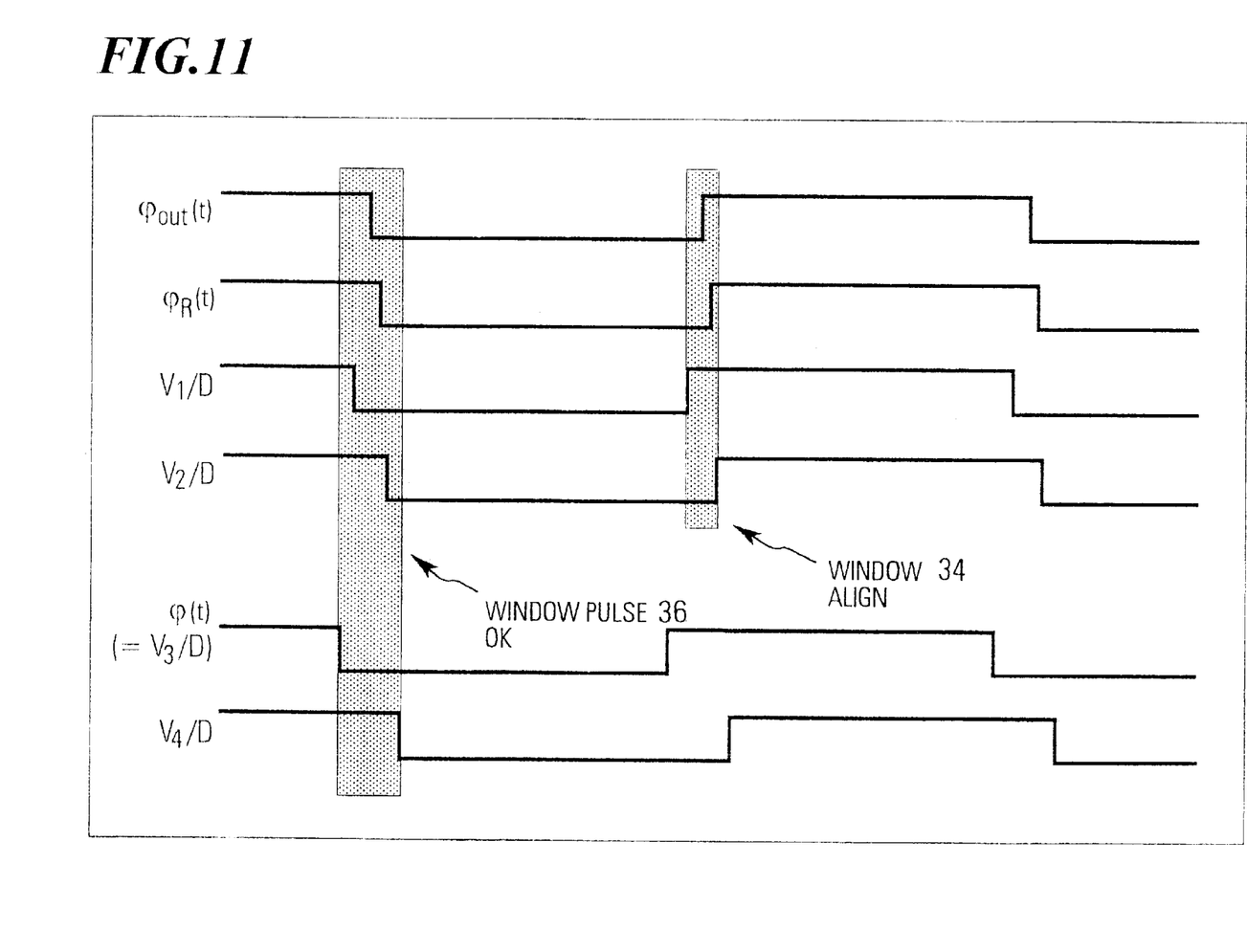
FIG. 11 shows a signal diagram illustrating the operation of the pulse detector shown in FIG. 10.

FIG. 11 shows a timing diagram illustrating the operation of the pulse detector shown in FIG. 10.

The pulse detector uses the comparison of the positive edges of the input clock pulse signal φ(t) and the reference clock pulse signal $φ_R(t)$ to derive phase alignment as outlined above.

In addition to this negative edges of the input clock pulse signal φ(t) and the reference clock pulse signal $φ_R(t)$ will be compared such that again a window is defined this time comprising an advanced time section $(d_1+d_3)$ being defined by the first delay unit 12 and the third delay unit 26 and a retarded time section being $(d_2+d_4)$ defined by the second delay unit 14 and the fourth delay unit 28.

The advantage of inserting an additional third delay unit 26 and a fourth delay unit 28 is that this allows to use different windows for the positive edges and negative edges of the input clock pulse signal φ(t).

In other words, the first delay unit 12 and the second delay unit 14 define a phase window for the positive edges and the third delay unit 26 and the fourth delay unit 28 define a phase window for the negative edges which are then used to classify the pulse distortion of the input clock pulse signal φ(t) by the output samples [$v_4, v_3, v_2, v_1$] (with x don't care) as follows:

| [v4, v3, v2, v1] | Meaning |
|---|---|
| [1, 0, 0, 1] | normal operation, positive and negative edges of $φ_{out}(t)$ and $φ_R(t)$ are in phase; |
| [1, 1, 0, 1] | positive edges of $φ_{out}(t)$ and $φ_R(t)$ are in |
| [0, 0, 0, 1] | phase, but not the negative edges; |
| [x, x, 1, 1] | $φ_{out}(t)$ and $φ_R(t)$ are out of phase, do not |
| [x, x, 0, 0] | care about negative edges; |

As shown in FIG. 11, the provision of a plurality of delay units 12, 14, 26, 28 allows to define an alignment window 34 used to indicate a phase difference between the input clock pulse signal φ(t) and the reference clock pulse signal $φ_R(t)$ and a time period window 36 indicating whether the pulse itself is okay, i.e. has the appropriate duty cycle with respect to the reference clock pulse signal $φ_R(t)$.

As shown in FIG. 11, the width of both time windows 34 and 36 may differ in compliance with application requirements. The actual duration of each such time window 34, 36 will be determined in compliance with the existing application requirements. One option is to select the time window for the time period of the input clock pulse signal φ(t) higher than the time window for phase alignment 34, e.g. in the range of up to 2.0 nsec.

In other words, in order to handle pulse distortion the time window 34 for alignment usually must be smaller than the time window 36 for the pulse period measurement. The size of the two time windows 34, 36 should be as small as possible to get good detection but large enough not to generate any alarms during normal operation.

Figure 12:
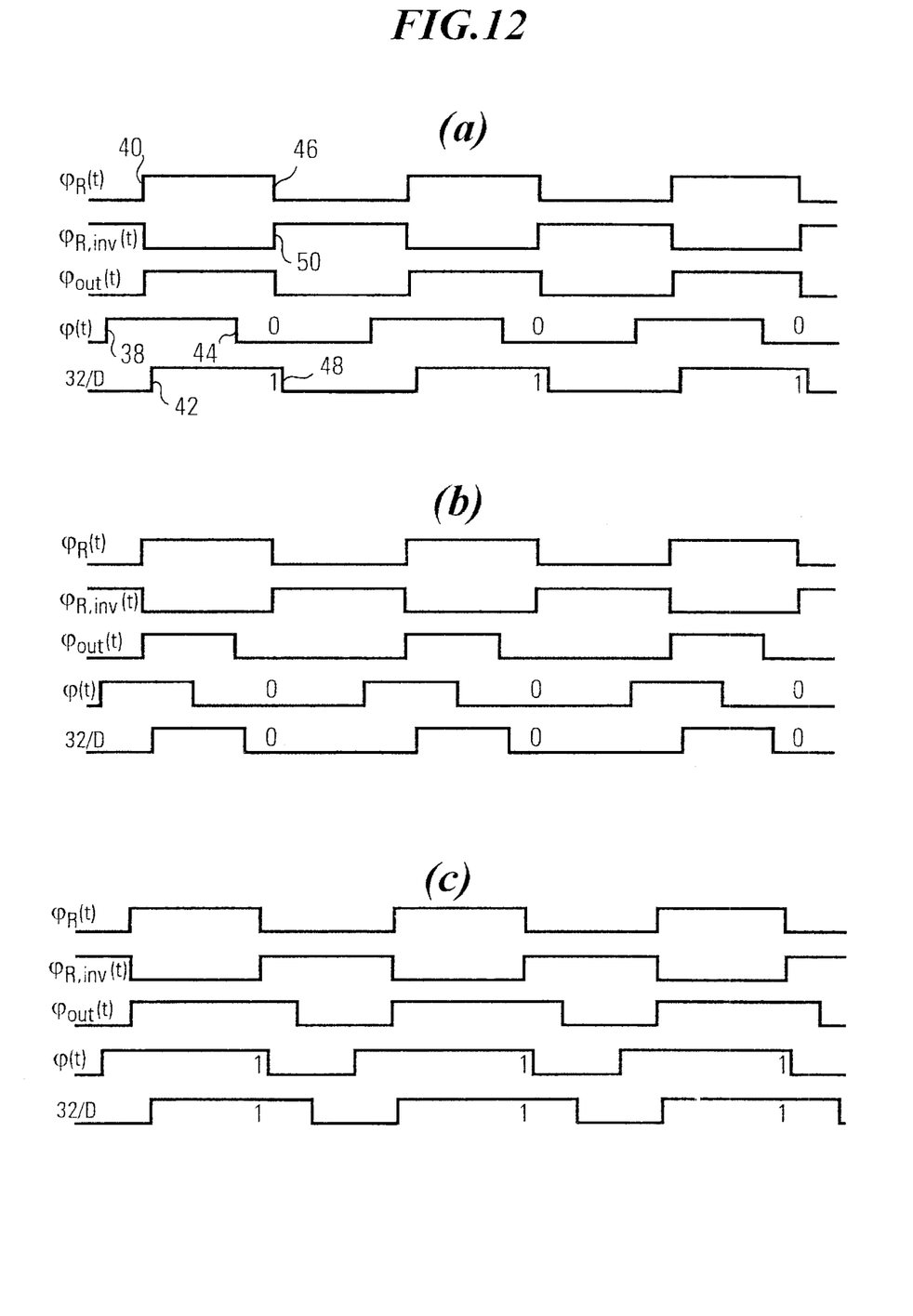
FIG. 12 shows a further signal diagram illustrating the operation of the pulse detector shown in FIG. 10.

FIG. 12 shows a further signal diagram illustrating the operation of the pulse detector shown in FIG. 10.

In particular, FIG. 12 shows that pulse duration detection is achieved through inversion of the reference clock pulse signal $φ_R(t)$ into the inverted reference clock pulse signal $φ_{R, inv}(t)$. Therefore each negative edge of the reference clock pulse signal $φ_R(t)$—defining the end of a time period— is related to the positive edge of the inverted reference clock pulse signal $φ_{R, inv}(t)$ triggering the pulse duration measurement.

As shown in FIG. 12 (a) and assuming a correct phase relationship, a positive edge 38 of the input to the third bistable unit 30 is advanced with respect to a positive edge 40 of the reference clock pulse signal $\phi_R(t)$. Also, a positive edge 42 of the input to the fourth bistable unit 32 is retarded with respect to the positive edge 40 of the reference clock pulse signal $\phi_R(t)$.

Further, in case the duty cycle of the output clock pulse $\phi_{out}(t)$ is correct a negative edge 44 of the input to the third bistable unit 30 is also advanced with respect to a negative edge 46 of the reference clock pulse signal $\phi_R(t)$ and a negative edge 48 of the input to the fourth bistable unit 32 is retarded with respect to the negative edge 46 of the reference clock pulse signal $\phi_R(t)$.

Therefore the sampling of V3/Q(t) and V4/Q(t) at the positive edge 50 of the inverted reference clock pulse signal $\phi_{R,\,inv}(t)$ will lead to a bit vector v3, v4=[0, 1] for indication of a correct output clock pulse time period.

As shown in FIG. 12(a) this bit vector pattern [0, 1] for indication of a correct output clock pulse duty cycle is maintained as long as the output clock pulse time period remains within the predefined range shown in FIG. 11.

To the contrary, in case the output clock pulse duty cycle is too short—as shown in FIG. 12(b)—or too long—as shown in FIG. 12(c)—this will lead to a bit vector [0, 0] or [1, 1] indicating an output clock pulse time period misalignment.

The pulse detector according to the present invention may be implemented in ASIC technology where the delay units can be built, e.g., using a number of inverters in series. The delay time of the delay units can be decided in compliance with the required bistable unit set up time, e.g., the required flip-flop set up time and the desired maximum size of each time window. Since the bistable units and the delay units are implemented in the same ASIC circuit they operate under the same operating environment. For a certain device the delay of the delay units will therefore be balanced against required set up time of the bistable units in case the temperature and/or the supply voltage varies.

What is claimed is:

1. A pulse detector, comprising:
   a first delay unit adapted to receive an input clock pulse signal and to delay said input clock pulse signal by a first pre-specified delay for output as an output clock pulse signal, said output clock pulse signal being available as an output of the pulse detector;
   a second delay unit adapted to delay said output clock pulse signal by a second pre-specified delay; and
   a first sampling unit adapted to sample said input clock pulse signal and an output of said second delay unit at a sampling time defined by a reference clock pulse signal, and to output samples of said input clock pulse signal and said output of said second delay unit for phase delay indication with reference to the output clock pulse signal.

2. The pulse detector of claim 1, wherein said first sampling unit comprises:
   a first bistable device adapted to generate a first sample, said first sample being a sample of said input clock pulse signal at said sampling time defined by the reference clock pulse signal;
   a second bistable device adapted to generate a second sample, said second sample being a sample of said output signal of said second delay unit at said sampling time defined by said reference clock pulse signal;
   wherein an in-phase condition is indicated when said first sample and said second sample are at different levels.

3. The pulse detector of claim 1, wherein said sampling time is defined by a positive edge of said reference clock pulse signal.

4. The pulse detector of claim 1, wherein said sampling time is defined by a negative edge of said reference clock pulse signal.

5. The pulse detector of claim 1, wherein said pre-specified delay of said first delay unit and/or second delay unit lies in the range of up to 10 percent of said output clock pulse signal time period.

6. The pulse detector of claim 1, which further comprises a second sampling unit adapted to sample said input clock pulse signal and a further delayed output of the second delay unit at a sampling time defined by an inverted reference clock pulse signal and to output said samples for input clock pulse distortion indication.

7. The pulse detector of claim 6, wherein at the input of said first delay unit there is provided a third delay unit being adapted to receive said input clock pulse signal and to delay it by a third pre-specified delay before supply to said first delay unit; and
   at the output of said second delay unit there is provided a fourth delay unit being adapted to receive said output signal of the second delay unit and to delay it by a fourth pre-specified delay before supply to said second sampling unit.

8. The pulse detector of claim 7, wherein said second sampling unit comprises:
   a third bistable device adapted to generate a third sample of said input clock pulse signal at said sampling time defined by said inverted reference clock pulse signal;
   a fourth bistable device adapted to generate a fourth sample of output signal of said fourth delay unit at said sampling time defined by said inverted reference clock pulse signal; wherein
      an identical level of said third sample and said fourth sample is an indication of input clock pulse distortion.

9. The pulse detector of claim 7, wherein the pre-specified delay of said third delay unit and/or said fourth delay unit lies in the range of up to 20 percent of said output clock pulse signal time period.

10. A pulse detection method, comprising the steps:
    receiving an input clock pulse signal and delaying said input clock pulse signal by a first pre-specified delay for output as an output clock pulse signal;
    outputting said output clock pulse signal as an output of the pulse detector;
    delaying said output clock pulse signal further by a second pre-specified delay; sampling said input clock pulse signal and said delayed output clock pulse signal at a sampling time defined by a reference clock pulse signal; and
    outputting said samples of said input clock pulse signal and said output of said second delay unit for phase delay indication with reference to the output clock pulse signal.

11. The pulse detection method of claim 10, which further comprises a step of sampling said input clock pulse signal and said delayed output clock pulse signal at a sampling time defined by said reference clock pulse signal inverted and outputting said samples for input clock pulse distortion indication.

12. The pulse detection method of claim 11, which further comprises the steps
    delaying said input clock pulse signal by a third pre-specified delay before said first delay; and
    delaying the outcome of said second delay by a fourth pre-specified delay before said second sampling.

* * * * *